(12) United States Patent
Olligs

(10) Patent No.: US 9,589,854 B2
(45) Date of Patent: Mar. 7, 2017

(54) ALIGNMENT MONITORING STRUCTURE AND ALIGNMENT MONITORING METHOD FOR SEMICONDUCTOR DEVICES

(71) Applicant: GLOBALFOUNDRIES Inc., Grand Cayman (KY)

(72) Inventor: Dominik Olligs, Dresden-Langebrueck (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/709,889

(22) Filed: May 12, 2015

(65) Prior Publication Data
US 2016/0336240 A1    Nov. 17, 2016

(51) Int. Cl.
| | | |
|---|---|---|
| H01L 21/70 | (2006.01) | |
| H01L 21/66 | (2006.01) | |
| H01L 27/02 | (2006.01) | |
| H01L 27/088 | (2006.01) | |
| H01L 23/535 | (2006.01) | |
| H01J 37/28 | (2006.01) | |
| G01B 15/00 | (2006.01) | |
| H01L 23/544 | (2006.01) | |
| H01L 27/112 | (2006.01) | |

(52) U.S. Cl.
CPC ............ *H01L 22/12* (2013.01); *G01B 15/00* (2013.01); *H01J 37/28* (2013.01); *H01L 23/535* (2013.01); *H01L 27/0207* (2013.01); *H01L 27/088* (2013.01); *H01L 23/544* (2013.01); *H01L 27/112* (2013.01); *H01L 2223/54453* (2013.01)

(58) Field of Classification Search
CPC ......... H01L 23/544; H01L 2223/54453; H01L 2223/54426; H01L 2223/5442; H01L 21/31051; H01L 21/823828; H01L 23/585; H01L 2924/0002; H01L 2924/00; G03F 9/7084
USPC .......... 257/390, 387, 369, 506, 401, E23.17; 438/401, 153, 264
See application file for complete search history.

(56) References Cited

U.S. PATENT DOCUMENTS

2016/0211383 A1*   7/2016   Harding ................ G06F 3/0412

* cited by examiner

*Primary Examiner* — Thinh T Nguyen
(74) *Attorney, Agent, or Firm* — Amerson Law Firm, PLLC

(57) ABSTRACT

The present disclosure provides in various aspects an alignment monitoring structure and method for monitoring the alignment between a target gate conductor and the corresponding target contact in a semiconductor device, for example, in a CMOS. In accordance with some illustrative embodiments herein, a structure with a plurality of gate conductors disposed over the substrate so as to define a row of parallel gate conductors and a plurality of first contacts is provided, wherein each of the first contacts is disposed between two adjacent gate conductors so as to define a first lateral distance between a first gate conductor and the first contact and a second lateral distance between the first contact and a second gate conductor, and wherein the first lateral distance and the second lateral distance vary systematically along the row of parallel gate conductors.

27 Claims, 2 Drawing Sheets

ALIGNMENT MONITORING STRUCTURE AND ALIGNMENT MONITORING METHOD FOR SEMICONDUCTOR DEVICES

BACKGROUND OF THE INVENTION

1. Field of the Invention

The present disclosure relates to alignment monitoring structures and methods for semiconductor devices and, more particularly, to alignment monitoring structures and methods for monitoring the alignment between target gate conductors and the corresponding target contacts in a semiconductor device.

2. Description of the Related Art

In semiconductor devices of the state-of-the-art and, in particular in CMOS products, it is crucial to have a good control of the alignment of the contact patterning to the gate patterns in order to prevent unintended contact-to-gate shorts. Typically, the alignment is checked by optical means at a few positions per exposure field only, so that systematic contributions to the alignment error inherent to photomask production are not avoided. Local information on alignment quality is not available. The size required for optical alignment marks prevents their placement within the chip, whose size is typically reduced.

In view of the above-described situation, it is, therefore, desirable to provide an alignment monitoring structure and a method for monitoring the alignment between target gate conductors and the corresponding target contacts such that the above-described issues and problems are at least reduced, if not avoided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides alignment monitoring structures and methods for monitoring the alignment between target gate conductors and the corresponding target contacts in a semiconductor device.

According to a first aspect of the present disclosure, an alignment monitoring structure for a semiconductor device is provided. In accordance with some illustrative embodiments herein, the structure includes a semiconductor substrate, a plurality of gate conductors disposed over the substrate so as to define a row of parallel gate conductors and a plurality of first contacts, wherein each of the first contacts is disposed between two adjacent gate conductors so as to define a first lateral distance between a first gate conductor and a first contact and a second lateral distance between the first contact and a second gate conductor and wherein the first lateral distance and the second lateral distance vary systematically along the row of parallel gate conductors.

According to a second aspect of the present disclosure, a semiconductor device is provided. In accordance with some illustrative embodiments herein, the semiconductor device includes an alignment monitoring structure for monitoring the alignment between target gate conductors and the corresponding target contacts in the semiconductor device.

According to a third aspect of the present disclosure, a method for monitoring the alignment between a target gate conductor and the corresponding target contact in a semiconductor device is provided. In accordance with some illustrative embodiments herein, the method includes comparing the result of a detection technique obtained for the target gate conductor and the corresponding target contact with the results of the same detection technique obtained for a plurality of reference gate conductors and the corresponding reference contacts, wherein the alignment between the reference gate conductors and the corresponding reference contacts is known.

According to a fourth aspect of the present disclosure, a method for monitoring the alignment between a target gate conductor and the corresponding target contact in a semiconductor device is provided. In accordance with some illustrative embodiments herein, the method includes the steps of providing the results of a detection technique obtained for the alignment monitoring structure, providing the results of the same detection technique for the target gate conductor and the corresponding target contact, and comparing the two sets of results so as to assess the alignment between the target gate conductor and the corresponding target contact.

According to a fifth aspect of the present disclosure, a method of manufacturing a semiconductor device including a plurality of gate conductors and the corresponding gate contacts is provided. In accordance with some illustrative embodiments herein, the method includes the step of monitoring the alignment between one or more of the gate conductors and the corresponding gate contacts.

BRIEF DESCRIPTION OF THE DRAWINGS

The disclosure may be understood by reference to the following description taken in conjunction with the accompanying drawings, in which like reference numerals identify like elements, and in which.

Figure 1:
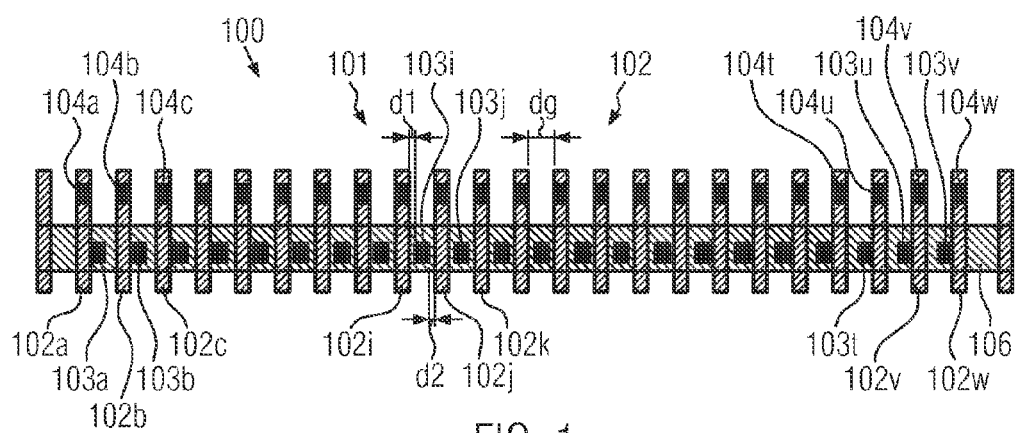
FIG. 1 schematically illustrates a top view of an alignment monitoring structure in accordance with an illustrative embodiment of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to an alignment monitoring structure and method for monitoring the alignment between one or more target gate conductors and the corresponding target contacts in a semiconductor device. In accordance with some illustrative embodiments of the present disclosure, the semiconductor devices may substantially represent CMOS devices. When referring to CMOS devices, the person skilled in the art will appreciate that, although the expression "CMOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example, smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length and/or width dimensions smaller than 100 nm, for example, smaller than 50 nm or smaller than 35 nm. For example, the present disclosure may provide semiconductor devices fabricated by using 45 nm technologies or below, for example, 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In the following, various illustrative embodiments of the present disclosure will be explicitly described with regard to the enclosed figures. In general, the terms "substrate," "semiconductor substrate" or "semiconducting substrate" should be understood to cover all semiconductor materials in all forms of such semiconductor materials and no limitation to a special kind of substrate is intended. The person skilled in the art will appreciate that, in some illustrative embodiments in which the substrate represents an SOI configuration cover, a thin silicon film (not illustrated) disposed on a buried oxide or BOX layer (not illustrated), which in turn is formed on a semiconductor substrate or a base wafer (not illustrated), may be present.

FIG. 1 shows an alignment monitoring structure 100 according an embodiment of the present disclosure. A row 102 of parallel gate conductors 102a to 102w is provided on a semiconductor substrate 101. The lateral distance dg between adjacent gate conductors is constant along the row 102 of parallel conductors. For example, the lateral distance between gate conductor 102a and 102b is equal to the lateral distance between gate conductor 102b and gate conductor 102c and so on along the entire row 102 so that, for example, the lateral distance between gate conductor 102v and gate conductor 102w at the right extremity of row 102 is also the same. According to embodiments of the present disclosure, the lateral distance dg between adjacent gate conductors is in the range from 20-100 nm, preferably in the range from 35-90 nm.

The dimensions of the gate conductors may vary. For example, the gate conductors may have a width in the range from 10-50 nm. The gate conductors may also have a width lower than 10 nm. The length of the gate conductors may be, for example, 200 nm or higher.

The structure is further provided with a plurality of first contacts 103a to 103v. In particular, each of the first contacts 103a to 103v is placed between two adjacent gate conductors of the row 102 of parallel gate conductors. For example, the first contact 103a is placed between gate conductor 102a and gate conductor 102b, the first contact 103b is placed between gate conductor 102b and gate conductor 102c and so on along the row 102 of parallel gate conductors so that, for example, the first contact 103v is placed between gate conductor 102v and gate conductor 102w. Each of the first contacts 103a to 103v accordingly defines a first lateral distance d1 between a first gate conductor of the pair of adjacent gate conductors and the first contact and a second lateral distance d2 between the first contact and the second gate conductor parallel to the first gate conductor and adjacent to it. For the sake of clarity, distances d1 and d2 are schematically marked in FIG. 1 only for one first contact of the structure, namely for first contact 103i placed between gate conductor 102i and gate conductor 102j. Lateral distance d1 is thus the lateral distance between gate conductor 102i and first contact 103i while lateral distance d2 is the lateral distance between first contact 103i and gate conductor 102j. However, it is clear for the skilled person that each of the first contacts 103a to 103v defines a lateral distance d1 with one of the two gate conductors of the pair of adjacent gate conductors and a second lateral distance d2 with the other gate conductor of the pair. A lateral distance of zero between a gate conductor and a first contact means that the gate conductor and the first contact are in electrical contact.

As can be seen in FIG. 1, the first lateral distance d1 and the second lateral distance d2 vary systematically along the row of parallel gate conductors. In particular, the first contact 103a is in electrical contact with the gate conductor 102a so that the lateral distance d1 between the first contact 103a and the gate conductor 102a is zero. Accordingly, the second lateral distance d2 between the first contact 103a and the gate conductor 102b is maximum. The value of the maximum lateral distance between a first contact and a gate conductor depends on the lateral distance dg between the pair of adjacent gate contacts and on the dimensions of the first contact. For example, the maximum lateral distance could be in the range of 10-40 nm. According to some embodiments of the present disclosure, the maximum lateral distance is 20 nm.

The first contact $103b$ is not in electrical contact with the gate conductor $102b$ so that the first lateral distance d1 between the gate conductor $102b$ and the first contact $103b$ is greater than zero, while the second lateral distance d2 between the first contact $103b$ and the gate conductor $102c$ is lower than the maximum second lateral distance.

As can be seen in FIG. 1, the first contact $103j$ is substantially in the middle between the two adjacent gate conductors $102j$ and $102k$ so that the lateral distances d1 and d2 are in this case substantially the same.

The first contact $103v$ is in electrical contact with the gate conductor $102w$ so that the second lateral distance d2 is in this case equal to zero while the first lateral distance d1 between the gate conductor $102v$ and the first contact $103v$ is maximum.

According to some embodiments of the present disclosure, the first lateral distance increases along the row of parallel gate conductors so that the second lateral distance accordingly decreases. For example, the first lateral distance increases linearly along the row of parallel gate conductors. The first lateral distance may also exhibit, for example, a quadratic or an exponential growth.

In the structure shown in FIG. 1, the first contact $103a$ is in electrical contact with the first gate conductor $102a$ of the row 102 of parallel gate conductors so that the first lateral distance d1 is zero and the second lateral distance d2 between the first contact $103a$ and the second gate conductor $102b$ of the row 102 is maximum. The distance d1 increases along the row 102 and the distance d2 accordingly decreases. The last gate conductor $102w$ of the row 102 of parallel gate conductors is in electrical contact with the first contact $103v$ so that the second lateral distance d2 is zero and the first lateral distance d1 between the first contact $103v$ and the gate conductor $102v$ is maximum. However, according to alternative embodiments of the disclosure, the second lateral distance does not decrease to zero along the row 102 of parallel gate conductors but may, for example, decrease to a minimum value which is higher than zero so that there is no electrical contact between the last gate conductor of the row 102 of parallel gate conductors and the corresponding first contact. For example, the arrangement could be such that the last first contact along the row 102 of parallel gate conductors is equidistant to the two adjacent gate conductors of the row of parallel gate conductors. In other words, in this exemplary arrangement, the first lateral distance d1 increases from zero to a maximum value which is equal to the value of the second lateral distance d2 between the last first contact along the row 102 and the last gate conductor of the row. According to further exemplary embodiments of the disclosure, the minimum value of the first lateral distance d1 is not zero but it is higher than zero.

FIG. 1 further shows that the structure 100 further comprises a plurality of second contacts $104a$ to $104w$. Each of the second contacts $104a$ to $104w$ is in contact with one of the gate conductors $102a$ to $102w$. In particular, each of the second contacts $104a$ to $104w$ is placed on top of the corresponding gate conductor $102a$ to $102w$, respectively, and is in direct contact with same. For example, the second contact $104a$ sits on top of the gate conductor $102a$ and is in contact with same. The second contact $104b$ sits on top of the gate conductor $102b$ and is in contact with same. The second contact $104w$ sits on top of and is in contact with the gate conductor $102w$.

FIG. 1 shows a further gate conductor on the left of the row 102 of parallel gate conductors and a further gate conductor on the right of the row 102 wherein there is no first contact between the gate conductor on the left of the row 102 and gate conductor $102a$ and between gate conductor $102w$ and the gate conductor on the right of the row 102. These gate conductors are not provided with second contacts. These "dummy" gate conductors are optional and they may be used in order to improve control on the width and placement of the "active" gate conductors of the row 102 of parallel gate conductors. The additional "dummy" gate conductors may, for example, be used to ensure that the distances between the first contacts and the gate conductors of the row 102 of parallel gate conductors vary as intended, e.g., linearly.

Figure 2:
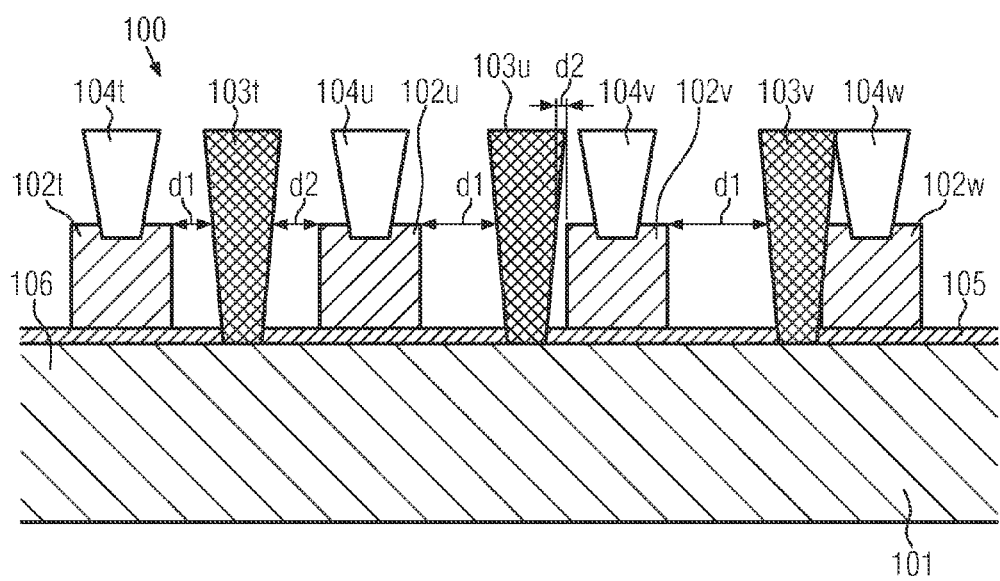
FIG. 2 schematically illustrates, in a cross-sectional view, a portion of the device shown in FIG. 1.

FIG. 2 schematically displays a cross-section of a portion of the structure shown in FIG. 1. The cross-section is not taken along a straight line, but rather along a broken line which crosses both the second contacts and the first contacts of the structure.

As can be seen in the portion of FIG. 2, the gate conductors $102a$ to $102w$ of the row 102 of parallel gate conductors are provided above an active region 106 of the substrate 101. The active region 106 is also schematically shown in FIG. 1. However, none of the gate conductors $102a$ to $102w$ of the row 102 is in direct contact with the active region 106 of the substrate 101. The gate conductors $102a$ to $102w$ are spaced apart from the active region 106 by means of the isolation layer 105. Examples of the thickness of the isolation layer 105 may range from 1-20 nm. According to particular embodiments of the present disclosure, the thickness of the isolation layer 105 is 5 nm or lower.

Each of the first contacts $103a$ to $103v$ of the structure 100 shown in FIG. 1 is in contact with the active region 106 of the semiconductor substrate 101.

As can be seen from FIG. 2, the first contact $103v$ is in electric contact with the gate conductor $102w$ so that the second lateral distance d2 is equal to zero. At the same time, the first lateral distance d1 between the first contact $103v$ and the gate conductor $102v$ is maximum. The first contact $103u$ is neither in electric contact with the gate conductor $102v$ nor with the gate conductor $102u$: both lateral distances d1 and d2 are higher than zero but the second lateral distance d2 between first contact $103u$ and gate conductor $102v$ is much lower than the first lateral distance d1 between first contact $103u$ and gate conductor $102u$. The first contact $103t$ is neither in electric contact with the gate conductor $102u$ nor with the gate conductor $102t$. However, distances d1 and d2 for first contact $103t$ are different from distances d1 and d2 for first contact $103u$.

In the following, an example of a method for monitoring the alignment between a target gate conductor and the corresponding target contact in a semiconductor device by means of an alignment monitoring structure 100 such as the one schematically shown in FIGS. 1 and 2 will be explained in detail.

The method according to an embodiment of the present disclosure is based on the observation that inspection of a wafer surface after final contact patterning, for example, after a metal polish process, with an electron beam device, such as a Scanning Electron Microscope (SEM) or an electron beam inspection tool, results in brightness contrasts between the conducting areas, such as the contacts, and the surrounding insulator, such as silicon dioxide. Moreover, the contacts appear with different brightness, depending on their electrical connection, namely on which structures they are connected to. For example, contacts sitting on a gate structure may appear darker, i.e., with a lower brightness, than contacts sitting on an active area of the substrate. Typically, brightness contrasts are caused by different currents of the secondary electrons emitted by the atoms excited by the electron beam of the inspection tool.

With an alignment monitoring structure 100 such as the one schematically shown in FIGS. 1 and 2, each of the first contacts 103a to 103v has a different first or second lateral distance to the corresponding gate conductor of the row 102 of parallel gate conductors 102a to 102w. Accordingly, only a subset of the gate conductors 102a to 102w is in contact with the active area 106 of the substrate 101 via the corresponding first contact. For example, as can be seen in FIG. 2, gate conductor 102w is in contact with the active area 106 by means of the first contact 103v. Accordingly and as a consequence of this, only a subset of the second contacts 104a to 104w is in contact with the active area 106 of the substrate 102 via the corresponding gate conductor and first contact. For example, as can be seen in FIG. 2, the second contact 104w is in contact with the active area 106 via the gate conductor 102w and the first contact 103v. In this case, a large reservoir for secondary electrons is made so that the brightness caused by the current of secondary electrons is high. On the contrary, there is no contact between second contacts 104t, 104u and 104v and the active area 106 of the substrate so that a small reservoir for secondary electrons is made. Accordingly, the brightness caused by the current of secondary electrons for these second contacts is low. Moreover, since the lateral distance between the first contacts and the corresponding gate conductors vary systematically, the brightness caused by the current of secondary electrons for the second contacts vary systematically as well. Still with reference to FIG. 2, the brightness obtained for second contact 104t will be different from the brightness obtained for second contact 104u and for second contact 104v.

As a result, the brightness resulting from an inspection with an electron beam device of each of second contacts 104a to 104w along the row 102 of the structure 100 depends on the quality of the contact between the second contact and the active area 106 and thus varies in a systematic way. A unique pattern is accordingly obtained and this pattern is used according to embodiments of the present disclosure to assess the alignment of a target contact with the corresponding target gate conductor in a semiconductor device, for example, in a semiconductor device comprising the alignment monitoring structure. The amount and direction of a possible misalignment between the target contact and the corresponding target gate conductor are determined, for example, comparing the brightness obtained with the detection technique for the target contact with the pattern obtained for the alignment monitoring structure.

Figure 3:
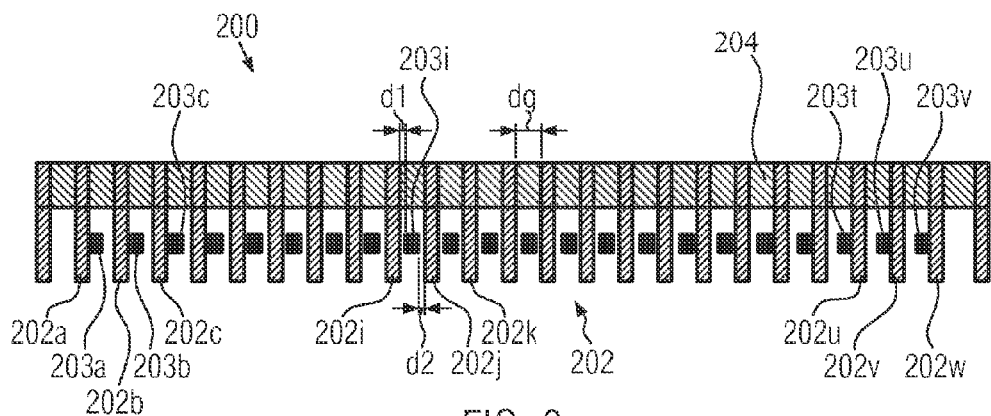
FIG. 3 schematically illustrates a top view of an alignment monitoring structure according to an embodiment of the present disclosure.

FIG. 3 shows an alignment monitoring structure 200 according to a further embodiment of the present disclosure. A row 202 of parallel gate conductors 202a to 202w is provided on a semiconductor substrate 201. The lateral distance dg between adjacent gate conductors is constant along the row 202 of parallel conductors. For example, the lateral distance between gate conductor 202a and 202b is equal to the lateral distance between gate conductor 202b and gate conductor 202c and so on along the entire row 202 so that, for example, the lateral distance between gate conductor 202v and gate conductor 202w at the right extremity of row 202 is also the same. According to some embodiments of the present disclosure, the lateral distance dg between adjacent gate conductors is in the range from 20-100 nm, preferably in the range from 35-90 nm.

The dimensions of the gate conductors may vary. For example, the gate conductors may have a width in the range from 10-50 nm. The gate conductors may also have a width lower than 10 nm. The length of the gate conductors may be, for example, 200 nm or higher.

The structure is further provided with a plurality of first contacts 203a to 203v. In particular, each of the first contacts 203a to 203v is placed between two adjacent gate conductors of the row 202 of parallel gate conductors. For example, the first contact 203a is placed between gate conductor 202a and gate conductor 202b, the first contact 203b is placed between gate conductor 202b and gate conductor 202c and so on along the row 202 of parallel gate conductors so that, for example, the first contact 203v is placed between gate conductor 202v and gate conductor 202w. Each of the first contacts 203a to 203v accordingly defines a first lateral distance d1 between a first gate conductor of the pair of adjacent gate conductors and the first contact and a second lateral distance d2 between the first contact and the second gate conductor parallel to the first gate conductor and adjacent to it. For the sake of clarity, distances d1 and d2 are schematically marked in FIG. 3 only for one first contact of the structure, namely for first contact 203i placed between gate conductor 202i and gate conductor 202j. Lateral distance d1 is thus the lateral distance between gate conductor 202i and first contact 203i while lateral distance d2 is the lateral distance between first contact 203i and gate conductor 202j. However, it is clear for the skilled person that each of the first contacts 203a to 203v defines a lateral distance d1 with one of the two gate conductors of the pair of adjacent gate conductors and a second lateral distance d2 with the other gate conductor of the pair. A lateral distance of zero between a gate conductor and a first contact means that the gate conductor and the first contact are in electrical contact.

As can be seen in FIG. 3, the first lateral distance d1 and the second lateral distance d2 vary systematically along the row 202 of parallel gate conductors. In particular, the first contact 203a is in electrical contact with the gate conductor 202a so that the lateral distance d1 between the first contact 203a and the gate conductor 202a is zero. Accordingly, the second lateral distance d2 between the first contact 203a and the gate conductor 202b is maximum. The value of the maximum lateral distance between a first contact and a gate conductor depends on the lateral distance dg between the pair of adjacent gate contacts and on the dimensions of the first contact. For example, the maximum lateral distance could be in the range of 10-40 nm. According to some embodiments of the present disclosure, the maximum lateral distance is 20 nm.

The first contact 203b is not in electrical contact with the gate conductor 202b so that the first lateral distance d1 between the gate conductor 202b and the first contact 203b is greater than zero, while the second lateral distance d2 between the first contact 203b and the gate conductor 202c is lower than the maximum second lateral distance.

As can be seen in FIG. 3, the first contact 203j is substantially in the middle between the two adjacent gate conductors 202j and 202k so that the lateral distances d1 and d2 are in this case substantially the same.

The first contact 203v is in electrical contact with the gate conductor 202w so that the second lateral distance d2 is in this case equal to zero while the first lateral distance d1 between the gate conductor 202v and the first contact 203v is maximum.

According to some embodiments of the present disclosure, the first lateral distance increases along the row of parallel gate conductors so that the second lateral distance accordingly decreases. For example, the first lateral distance increases linearly along the row of parallel gate conductors. The first lateral distance may also exhibit, for example, a quadratic or an exponential growth.

In the structure shown in FIG. 3, the first contact 203a is in electrical contact with the first gate conductor 202a of the row 202 of parallel gate conductors so that the first lateral distance d1 is zero and the second lateral distance d2 between the first contact 203a and the second gate conductor 202b of the row 202 is maximum. The distance d1 increases along the row 202 and the distance d2 accordingly decreases. The last gate conductor 202w of the row 202 of parallel gate conductors is in electrical contact with the first contact 203v so that the second lateral distance d2 is zero and the first lateral distance d1 between the first contact 203v and the gate conductor 202v is maximum. However, according to alternative embodiments of the disclosure, the second lateral distance does not decrease to zero along the row 202 of parallel gate conductors but may, for example, decrease to a minimum value which is higher than zero so that there is no electrical contact between the last gate conductor of the row 202 of parallel gate conductors and the corresponding first contact. For example, the arrangement could be such that the last first contact along the row 202 of parallel gate conductors is equidistant to the two adjacent gate conductors of the row of parallel gate conductors. In other words, in this exemplary arrangement, the first lateral distance d1 increases from zero to a maximum value which is equal to the value of the second lateral distance d2 between the last first contact along the row 202 and the last gate conductor of the row. According to further exemplary embodiments of the disclosure, the minimum value of the first lateral distance d1 is not zero but it is higher than zero.

FIG. 3 further shows that the gate conductors 202a to 202w of the row 202 of parallel gate conductors are electrically connected to each other by means of the contact stripe 204 which extends along the entire row 202 of parallel gate conductors 202a to 202w.

FIG. 3 shows a further gate conductor on the left of the row 202 of parallel gate conductors and a further gate conductor on the right of the row 202 wherein there is no first contact between the gate conductor on the left of the row 202 and gate conductor 202a and between gate conductor 202w and the gate conductor on the right of the row 202. These "dummy" gate conductors are optional and they may be used in order to improve control on the width and placement of the "active" gate conductors of the row 202 of parallel gate conductors. The additional "dummy" gate conductors may, for example, be used to ensure that the distances between the first contacts and the gate conductors of the row 202 of parallel gate conductors vary as intended, e.g., linearly.

Figure 4:
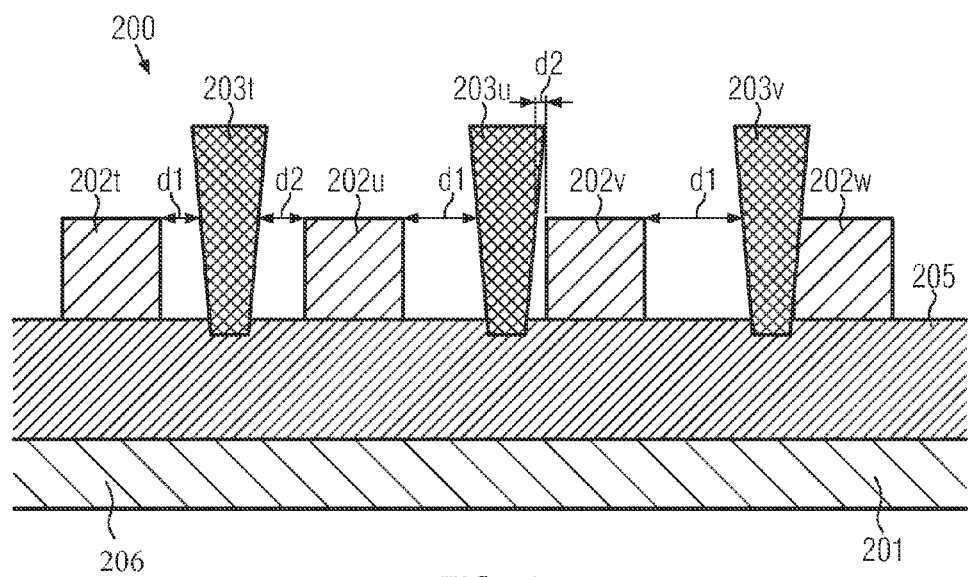
FIG. 4 schematically illustrates, in a cross-sectional view, a portion of the device shown in FIG. 3.

FIG. 4 schematically displays a cross-section of a portion of the structure shown in FIG. 3. As can be seen in the portion of FIG. 4, the gate conductors 202a to 202w of the row 202 of parallel gate conductors are provided above an active region 206 of the substrate 201. However, none of the gate conductors 202a to 202w of the row 202 is in direct contact with the active region 206 of the substrate 201. The gate conductors 202a to 202w are spaced apart from the active region 206 by means of the isolation layer 205. Examples of the thickness of the isolation layer 205 may range from 100-400 nm, for example, 250 nm (shallow trench isolation).

Similarly, none of the first contacts 203a to 203v of the structure 200 shown in FIG. 3 is in contact with an active region of the semiconductor substrate 201 but they are spaced apart from the active region of the substrate by means of the isolation layer 205.

As can be seen from FIG. 4, the first contact 203v is in electric contact with the gate conductor 202w so that the second lateral distance d2 is equal to zero. At the same time, the first lateral distance d1 between the first contact 203v and the gate conductor 202v is maximum. The first contact 203u is neither in electric contact with the gate conductor 202v nor with the gate conductor 202u: both lateral distances d1 and d2 are higher than zero but the second lateral distance d2 between first contact 203u and gate conductor 202v is much lower than the first lateral distance d1 between first contact 203u and gate conductor 202u. The first contact 203t is neither in electric contact with the gate conductor 202u nor with the gate conductor 202t. However, distances d1 and d2 for first contact 203t are different from distances d1 and d2 for first contact 203u.

In the following, an example of a method for monitoring the alignment between a target gate conductor and the corresponding target contact in a semiconductor device by means of an alignment monitoring structure 200 such as the one schematically shown in FIGS. 3 and 4 will be explained in detail.

Also in this case, the method is based on the observation that inspection of a wafer surface after final contact patterning, for example, after a metal polish process, with an electron beam device, such as a Scanning Electron Microscope (SEM) or an electron beam inspection tool, results in brightness contrasts between the conducting areas, such as the contacts, and the surrounding insulator, such as silicon dioxide. Moreover, the contacts appear with different brightness, depending on their electrical connection, namely on which structures they are connected to. For example, contacts sitting on a gate structure may appear darker, i.e., with a lower brightness, than contacts sitting on an active area of the substrate. Typically brightness contrasts are caused by different currents of the secondary electrons emitted by the atoms excited by the electron beam of the inspection tool.

With an alignment monitoring structure 200 such as the one schematically shown in FIGS. 3 and 4, each of the first contacts 203a to 203v has a different first or second lateral distance to the corresponding gate conductor of the row 202 of parallel gate conductors 202a to 202w. The gate conductors 202a to 202w are connected to each other by means of the contact stripe 204 and have a high coupling capacity to the substrate 201. The first contacts 203a to 203v are not connected to the semiconductor substrate 201, they are placed on top of the insulating layer 205, for example, a field oxide or STI. Only a subset of the gate conductors 202a to 202w is in contact with the corresponding first contact so that only a subset of the first contacts is coupled to the gate conductor. Moreover, the quality of the connection or of the insulation varies systematically as the first or second lateral distances vary systematically as well. Accordingly, the brightness obtained for the first contacts electrically connected to a gate conductor is strongly different from the brightness of isolated contacts and it varies systematically along the row 202.

For example, as can be seen in FIG. 4, gate conductor 202w is in contact with the first contact 203v. In this case, a large reservoir for secondary electrons is made so that the brightness caused by the current of secondary electrons is high. On the contrary, there is no contact between first contacts 203t, 203u and 203v and the corresponding gate conductors 202t, 203u and 202v, respectively, so that a small reservoir for secondary electrons is made. Accordingly, the brightness caused by the current of secondary electrons for these first contacts is low. Moreover, since the lateral distance between the first contacts and the corresponding gate conductors vary systematically, the brightness caused by the current of secondary electrons for the first contacts vary systematically as well. Still with reference to FIG. 4, the brightness obtained for first contact 203t will be different from the brightness obtained for first contact 203u and for first contact 203v.

As a result, the brightness resulting from an inspection with an electron beam device of each of first contacts 203a to 203w along the row 202 of the structure 200 depends on the quality of the contact between the first contact and the gate conductor and thus varies in a systematic way. A unique pattern is accordingly obtained and this pattern is used according to embodiments of the present disclosure to assess the alignment of a target contact with the corresponding target gate conductor in a semiconductor device, for example, in a semiconductor device comprising the alignment monitoring structure. The amount and direction of a possible misalignment between the target contact and the corresponding target gate conductor are determined, for example, comparing the brightness obtained with the detection technique for the target contact with the pattern obtained for the alignment monitoring structure.

According to some embodiments of the present disclosure, a method of manufacturing a semiconductor device including one or more gate conductors and the corresponding gate contacts, for example, a CMOS device, is provided, wherein the method includes the step of monitoring the alignment between the one or more gate conductors and the corresponding gate contacts. The method for monitoring the alignment according to some embodiments of the present disclosure may be carried out, for example, after the final contact patterning of the semiconductor device, for example, after a step of metal polish.

Still according to some embodiments of the present disclosure, the alignment monitoring structure is directly provided in the semiconductor device which is manufactured. For example, chips with regular repeating patterns are typically manufactured, for example, arrays of memory cells. These systems usually comprise dummy features to ensure proper patterning. The alignment monitoring structure can be integrated on these systems at the array edges of these contacts together with dummy gate conductor features, and they can thus be used to generate the additional contacts for the brightness patterns that are required for electron beam reading of alignment information. Accordingly, a low area penalty or even no area penalty at all may be obtained.

For example, typical values of the area occupied by alignment monitoring structures according to embodiments of the present disclosure may be of the order of 1 µm². A stand-alone structure could be placed, for example, within 1 µm². Considering an appropriate distance to the active circuitry of the semiconductor device, the total area penalty may be, for example, on the order of 10 µm².

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. An alignment monitoring structure for a semiconductor device, said alignment monitoring structure comprising:
    a semiconductor substrate;
    a plurality of gate conductors disposed over said substrate so as to define a row of parallel gate conductors; and
    a plurality of first contacts, wherein each of said first contacts is disposed between two adjacent gate conductors so as to define a first lateral distance between a first gate conductor and said first contact and a second lateral distance between said first contact and a second gate conductor and wherein said first lateral distance and said second lateral distance each vary along said row of parallel gate conductors in accordance with a function of a distance along said row.

2. The alignment monitoring structure of claim 1, wherein a lateral distance between adjacent gate conductors is constant along said row of parallel gate conductors.

3. The alignment monitoring structure of claim 1, wherein said first lateral distance increases along said row of parallel gate conductors.

4. The alignment monitoring structure of claim 1, wherein said function for said first lateral distance comprises an increasing linear function.

5. The alignment monitoring structure of claim 1, wherein a first gate conductor of said row of parallel gate conductors is in contact with a corresponding first of said plurality of first contacts so that said first lateral distance between said first gate conductor of said row of parallel gate conductors and said first of said plurality of first contacts is zero.

6. The alignment monitoring structure of claim 1, wherein a last gate conductor of said row of parallel gate conductors is in contact with a corresponding last of said plurality of first contacts so that said second lateral distance between said last gate conductor of said row of parallel gate conductors and said last of said plurality of first contacts is zero.

7. The alignment monitoring structure of claim 1, wherein said first lateral distance varies from zero to a maximum first lateral distance along said row of parallel gate conductors so that said second lateral distance varies from a maximum second lateral distance to zero along the same direction along said row of parallel gate conductors.

8. The alignment monitoring structure of claim 7, wherein said maximum first lateral distance is equal to or less than a lateral distance between adjacent gate conductors.

9. The alignment monitoring structure of claim 1, wherein each of said plurality of first contacts is in contact with a layer of insulating material.

10. The alignment monitoring structure of claim 1, further comprising a plurality of second contacts, wherein each of said second contacts is in contact with one of said gate conductors.

11. The alignment monitoring structure of claim 1, wherein said plurality of gate conductors are electrically connected to each other.

12. The alignment monitoring structure of claim 11, wherein said plurality of gate conductors are electrically connected to each other by means of a contact stripe extending along the entire row of parallel gate conductors.

13. The alignment monitoring structure of claim 1, wherein said plurality of gate conductors and said plurality of first contacts are positioned above a layer of insulating material.

14. An alignment monitoring structure for a semiconductor device, said alignment monitoring structure comprising:
a semiconductor substrate;
a plurality of gate conductors disposed over said substrate so as to define a row of parallel gate conductors, wherein a lateral distance between adjacent gate conductors is constant along said row of parallel gate conductors; and
a plurality of first contacts, wherein each of said first contacts is disposed between two adjacent gate conductors so as to define a first lateral distance between a first gate conductor and said first contact and a second lateral distance between said first contact and a second gate conductor and wherein said first lateral distance and said second lateral distance vary along said row of parallel gate conductors in accordance with a function of a distance along said row, wherein said first lateral distance varies in accordance with an increasing linear function in a first direction and said second lateral distance varies in accordance with a decreasing linear function in said first direction.

15. The alignment monitoring structure of claim 14, wherein:
a first gate conductor of said row of parallel gate conductors is in contact with a corresponding first of said plurality of first contacts so that said first lateral distance between said first gate conductor of said row of parallel gate conductors and said first of said plurality of first contacts is zero; and
a last gate conductor of said row of parallel gate conductors is in contact with a corresponding last of said plurality of first contacts so that said second lateral distance between said last gate conductor of said row of parallel gate conductors and said last of said plurality of first contacts is zero.

16. The alignment monitoring structure of claim 14, wherein said first lateral distance varies from zero to a maximum first lateral distance along said row of parallel gate conductors so that said second lateral distance varies from a maximum second lateral distance to zero along the same direction along said row of parallel gate conductors.

17. The alignment monitoring structure of claim 16, wherein said maximum first lateral distance and said maximum second lateral distance are each equal to or less than said lateral distance between adjacent gate conductors.

18. The alignment monitoring structure of claim 15, further comprising a plurality of second contacts, wherein each of said second contacts is in contact with one of said gate conductors.

19. The alignment monitoring structure of claim 15, wherein said gate conductors are electrically connected to each other.

20. The alignment monitoring structure of claim 19, wherein said gate conductors are electrically connected to each other by means of a contact stripe extending along the entire row of parallel gate conductors.

21. The alignment monitoring structure of claim 20, wherein said plurality of gate conductors and said plurality of first contacts are positioned above a layer of insulating material.

22. An alignment monitoring structure for a semiconductor device, said alignment monitoring structure comprising:
a semiconductor substrate;
a plurality of gate conductors disposed over said substrate so as to define a row of parallel gate conductors, wherein a lateral distance between adjacent gate conductors is constant along said row of parallel gate conductors;
a conductive contact stripe extending along the entire row of parallel gate conductors that electrically couples each of the plurality of parallel gate conductors to one another:
a plurality of first contacts, wherein:
each of said first contacts is disposed between two adjacent gate conductors so as to define a first lateral distance between a first gate conductor and said first contact and a second lateral distance between said first contact and a second gate conductor, wherein said first lateral distance varies in accordance with an increasing function of a distance along said row of parallel gate conductors in a first direction and said second lateral distance varies in accordance with a decreasing function of the distance along said row of parallel gate conductors in said first direction;
a first gate conductor of said row of parallel gate conductors is in contact with a corresponding first of said plurality of first contacts so that said first lateral distance between said first gate conductor of said row of parallel gate conductors and said first of said plurality of first contacts is zero;
a last gate conductor of said row of parallel gate conductors is in contact with a corresponding last of said plurality of first contacts so that said second lateral distance between said last gate conductor of said row of parallel gate conductors and said last of said plurality of first contacts is zero; and
a plurality of second contacts, wherein each of said second contacts is in contact with one of said gate conductors.

23. The alignment monitoring structure of claim 22, wherein said first lateral distance varies from zero to a maximum first lateral distance along said row of parallel gate conductors so that said second lateral distance varies from a maximum second lateral distance to zero along the same direction along said row of parallel gate conductors.

24. The alignment monitoring structure of claim 23, wherein said maximum first lateral distance and said maximum second lateral distance are each equal to or less than said lateral distance between adjacent gate conductors.

25. The alignment monitoring structure of claim 22, wherein said plurality of gate conductors and said plurality of first contacts are positioned above a layer of insulating material.

26. The method of claim 1, wherein said function comprises one of a linear function, a quadratic function, or an exponential function.

27. The method of claim 14, wherein said increasing function and said decreasing function each comprises one of a linear function, a quadratic function, or an exponential function.

* * * * *